United States Patent
Fukumoto et al.

(10) Patent No.: US 11,530,798 B2
(45) Date of Patent: Dec. 20, 2022

(54) WAVELENGTH CONVERSION MEMBER, METHOD FOR MANUFACTURING SAME, AND LIGHT EMISSION DEVICE

(71) Applicant: NIPPON ELECTRIC GLASS CO., LTD., Otsu (JP)

(72) Inventors: Shotaro Fukumoto, Otsu (JP); Shunsuke Fujita, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 17/437,075

(22) PCT Filed: Apr. 6, 2020

(86) PCT No.: PCT/JP2020/015529
§ 371 (c)(1),
(2) Date: Sep. 8, 2021

(87) PCT Pub. No.: WO2020/213455
PCT Pub. Date: Oct. 22, 2020

(65) Prior Publication Data
US 2022/0163187 A1    May 26, 2022

(30) Foreign Application Priority Data

Apr. 18, 2019    (JP) .............................. JP2019-079330

(51) Int. Cl.
*C09K 5/14*    (2006.01)
*F21V 9/30*    (2018.01)
(Continued)

(52) U.S. Cl.
CPC .................. *F21V 9/30* (2018.02); *C09K 5/14* (2013.01); *C09K 11/025* (2013.01); *C09K 11/7774* (2013.01); *F21Y 2115/30* (2016.08)

(58) Field of Classification Search
CPC ...... C09K 11/7774; C09K 11/025; C09K 5/14
(Continued)

(56) References Cited

U.S. PATENT DOCUMENTS 5,998,925 A    12/1999  Shimizu et al.
6,069,440 A    5/2000   Shimizu et al.
(Continued)

FOREIGN PATENT DOCUMENTS

JP    2000-208815 A    7/2000
JP    2003-258308 A    9/2003
(Continued)

OTHER PUBLICATIONS

Official Communication issued in International Patent Application No. PCT/JP2020/015529, dated Jun. 9, 2020.

*Primary Examiner* — Christopher M Raabe
(74) *Attorney, Agent, or Firm* — Keating and Bennett, LLP

(57) ABSTRACT

The purpose is to provide a wavelength conversion member, a method for manufacturing the wavelength conversion member, and a light-emitting device, which are capable of reducing the temperature rise of the wavelength conversion member and thus reducing the decrease in luminescence intensity with time and deformation and discoloration of constituent materials. A wavelength conversion member 10 includes a matrix 1 and phosphor particles 3 dispersed in the matrix 1, wherein the matrix 1 is formed of a porous oxide body 2 having an average pore diameter of 50 μm or less.

20 Claims, 2 Drawing Sheets

(51) Int. Cl.
  *C09K 11/02*   (2006.01)
  *C09K 11/77*   (2006.01)
  *F21Y 115/30*  (2016.01)

(58) Field of Classification Search
  USPC .......................................................... 362/84
  See application file for complete search history.

(56) References Cited

U.S. PATENT DOCUMENTS

| | | |
|---|---|---|
| 2009/0314989 A1 | 12/2009 | Iwao et al. |
| 2011/0198539 A1 | 8/2011 | Iwao et al. |
| 2012/0181919 A1 | 7/2012 | Wei |
| 2017/0023199 A1 | 1/2017 | Hamada et al. |
| 2020/0142288 A1 | 5/2020 | Okuno et al. |
| 2020/0255729 A1 | 8/2020 | Okuno et al. |
| 2020/0357959 A1* | 11/2020 | Dreeben ............... H01L 33/501 |
| 2020/0392401 A1* | 12/2020 | Ito ......................... C04B 41/009 |
| 2021/0018160 A1* | 1/2021 | Takaku .................. G02B 7/181 |
| 2021/0175394 A1* | 6/2021 | Nakamura ............. G02B 5/206 |
| 2021/0341823 A1* | 11/2021 | Nishi ........................ F21V 9/40 |
| 2022/0131051 A1* | 4/2022 | Bao ....................... H01L 33/501 |

FOREIGN PATENT DOCUMENTS

| | | |
|---|---|---|
| JP | 2007-182529 A | 7/2007 |
| JP | 4895541 B2 | 3/2012 |
| JP | 2016-204563 A | 12/2016 |
| JP | 2017-028251 A | 2/2017 |
| JP | 2017-079328 A | 4/2017 |
| WO | 2017/098730 A1 | 6/2017 |
| WO | 2018/155671 A1 | 8/2018 |
| WO | 2018/179654 A1 | 10/2018 |

* cited by examiner

[FIG. 1.]
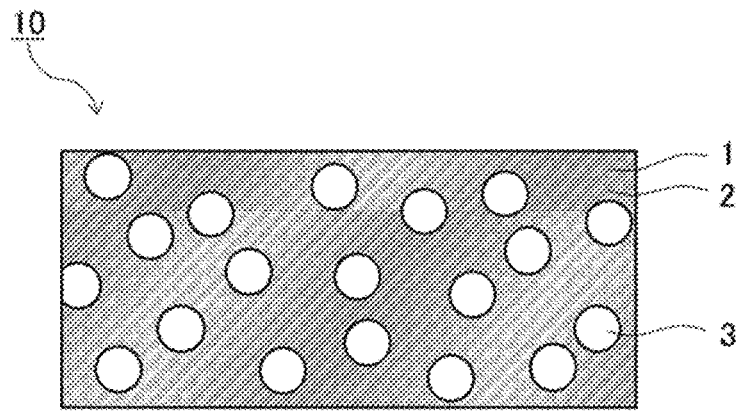
[FIG. 2.]
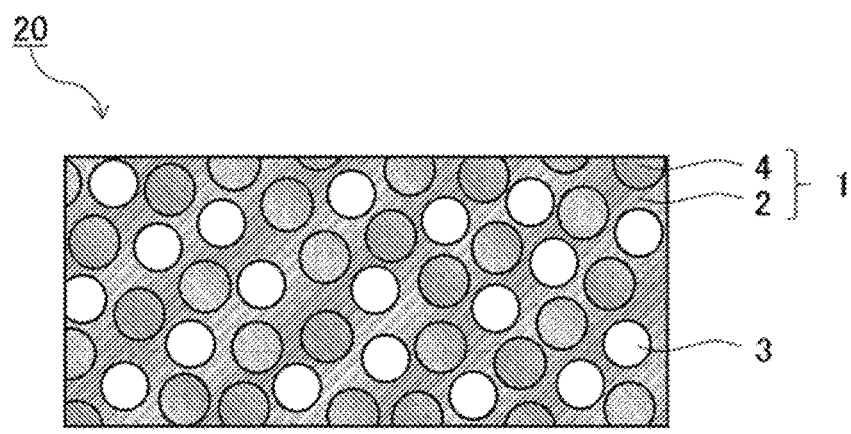
[FIG. 3.]
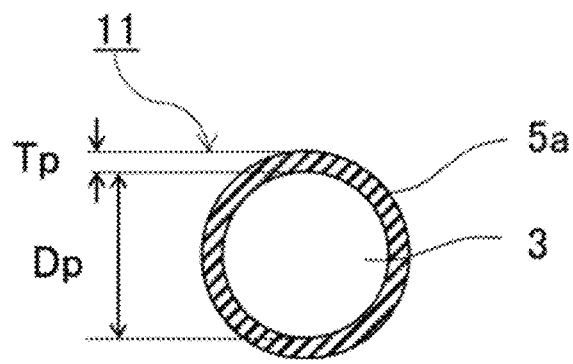

[FIG. 4.]
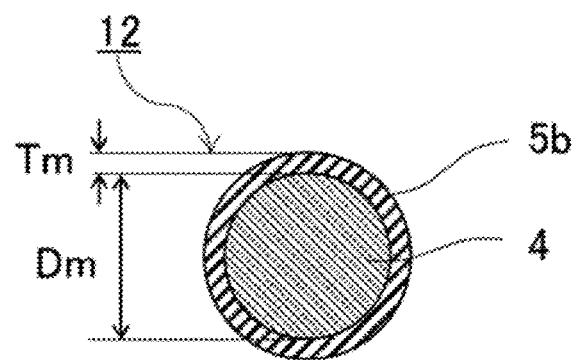
[FIG. 5.]
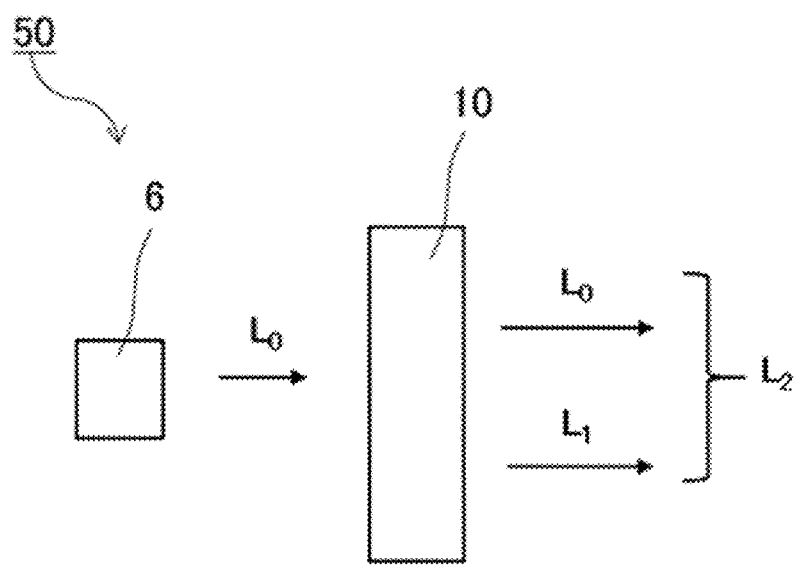

WAVELENGTH CONVERSION MEMBER, METHOD FOR MANUFACTURING SAME, AND LIGHT EMISSION DEVICE

TECHNICAL FIELD

The present invention relates to wavelength conversion members for converting the wavelength of light emitted from light emitting diodes (LEDs), laser diodes (LDs) or the like to another wavelength, methods for manufacturing the wavelength conversion members, and light-emitting devices.

BACKGROUND ART

Attention has been focused on light-emitting devices using LEDs or LDs from the viewpoint of their low power consumption, small size, light weight, and easy adjustment to light intensity. For example, a light-emitting device in which a wavelength conversion member capable of absorbing part of light from an LED is disposed above the LED emits a synthetic light (a white light) of an excitation light (for example, a blue light) emitted from the LED and a converted light (for example, a yellow light) emitted from the wavelength conversion member. For example, a wavelength conversion member is disclosed in which phosphor particles are dispersed and set in a resin matrix or a glass matrix (Patent Literatures 1 to 3).

CITATION LIST

Patent Literature

[PTL 1]
JP-A-2000-208815
[PTL 2]
JP-A-2003-258308
[PTL 3]
JP-B2-4895541

SUMMARY OF INVENTION

Technical Problem

Recently, with increasing power of light-emitting devices, the intensity of their excitation light is increasing. When a wavelength conversion member is irradiated with high-intensity excitation light, the intensity of heat emitted by the phosphor particles increases, so that the wavelength conversion member is likely to have excessive heat. Such a conventional wavelength conversion member has, due to the above excessive heat, a problem that the luminescence intensity decreases with time (temperature quenching) and a problem that constituent materials are likely to cause deformation, discoloration, and so on.

In view of the foregoing, the present invention has an object of providing a wavelength conversion member, a method for manufacturing the wavelength conversion member, and a light-emitting device, which are capable of reducing the temperature rise of the wavelength conversion member and thus reducing the decrease in luminescence intensity with time and deformation and discoloration of constituent materials.

Solution to Problem

A wavelength conversion member according to the present invention is a wavelength conversion member including a matrix and phosphor particles dispersed in the matrix, wherein the matrix is formed of a porous oxide body having an average pore diameter of 5 μm or less.

In the above structure, the matrix is formed of a porous oxide body having an average pore diameter of 5 μm or less. Since the wavelength conversion member includes the above matrix, the skeleton of the porous oxide body serves as a heat path upon application of excitation light to the wavelength conversion member, so that heat emitted by the phosphor particles can be easily and efficiently released to the outside. As a result, the temperature rise of the wavelength conversion member can be easily reduced, so that the decrease in luminescence intensity with time (temperature quenching) and the deformation and discoloration of the matrix can be easily reduced. Furthermore, excitation light is scattered by porous portions and therefore more frequently enters the phosphor particles, so that the luminous efficiency of the wavelength conversion member can be easily increased.

In the wavelength conversion member according to the present invention, the matrix preferably has a porosity of 10% or less. Thus, heat produced in the wavelength conversion member can be easily and efficiently released to the outside. In addition, excessive light scattering inside the wavelength conversion member can be easily reduced.

In the wavelength conversion member according to the present invention, the matrix is preferably made of magnesium oxide.

In the wavelength conversion member according to the present invention, the matrix preferably further contains thermally conductive particles.

In the wavelength conversion member according to the present invention, the thermally conductive particles are preferably made of magnesium oxide.

The wavelength conversion member according to the present invention preferably satisfies a condition (A) below where $D_p$ represents an average particle diameter of the phosphor particles and $D_m$ represents an average particle diameter of the thermally conductive particles:

$$0.1 \leq D_p/D_m \leq 10 \quad (A)$$

In the wavelength conversion member according to the present invention, a content of the phosphor particles is preferably 0.01 to 80% by volume.

A wavelength conversion member according to the present invention includes phosphor particles dispersed in a matrix made of an oxide and has a thermal diffusivity of $2\times10^{-6}$ m²/s or more.

In the above structure, the wavelength conversion member has a thermal diffusivity as high as $2\times10^{-6}$ m²/s or more. Since the wavelength conversion member has the above thermal diffusivity, heat produced in the wavelength conversion member can be easily and efficiently released to the outside.

The wavelength conversion member according to the present invention preferably has a quantum efficiency of 20% or more.

In the wavelength conversion member according to the present invention, a product of respective values of a thermal diffusivity (m²/s) and a quantum efficiency (%) is preferably $8\times10^{-5}$ or more.

A method for manufacturing a wavelength conversion member according to the present invention is a method for manufacturing the above-described wavelength conversion member and includes the step of mixing and firing phosphor particles and a metallic salt to foam the metallic salt and thus make a porous oxide body.

The method for manufacturing a wavelength conversion member according to the present invention preferably includes the steps of: coating the phosphor particles with the metallic salt to prepare metallic salt-coated phosphor particles; and firing the metallic salt-coated phosphor particles to foam the metallic salt and thus make a porous oxide body.

The method for manufacturing a wavelength conversion member according to the present invention preferably satisfies a condition (B) below where $T_p$ represents a thickness of coating layers of the metallic salt-coated phosphor particles and $D_p$ represents an average particle diameter of the phosphor particles:

$$0.01 \leq T_p/D_p \leq 0.3 \tag{B}$$

A method for manufacturing a wavelength conversion member according to the present invention is a method for manufacturing the above-described wavelength conversion member and includes the step of mixing and firing phosphor particles, thermally conductive particles, and a metallic salt to foam the metallic salt and thus make a porous oxide body.

The method for manufacturing a wavelength conversion member according to the present invention preferably includes the steps of: coating the thermally conductive particles with a metallic salt to prepare metallic salt-coated thermally conductive particles; and mixing and firing phosphor particles and the metallic salt-coated thermally conductive particles to foam the metallic salt and thus make a porous oxide body.

The method for manufacturing a wavelength conversion member according to the present invention preferably satisfies a condition (C) below where $T_m$ represents a thickness of coating layers of the metallic salt-coated thermally conductive particles and $D_m$ represents an average particle diameter of the thermally conductive particles:

$$0.01 \leq T_m/D_m \leq 0.3 \tag{C}$$

In the method for manufacturing a wavelength conversion member according to the present invention, a metallic element contained in the metallic salt is preferably of the same type as a metallic element contained as a main component in the thermally conductive particles.

In the method for manufacturing a wavelength conversion member according to the present invention, it is preferred that the phosphor particles are coated with the metallic salt to prepare metallic salt-coated phosphor particles and the metallic salt-coated phosphor particles and the metallic salt-coated thermally conductive particles are mixed and fired.

In the method for manufacturing a wavelength conversion member according to the present invention, the metallic salt is preferably composed of a carbonate and/or a hydroxide salt.

In the method for manufacturing a wavelength conversion member according to the present invention, the firing is preferably performed by hot pressing.

In the method for manufacturing a wavelength conversion member according to the present invention, a maximum temperature during the firing is preferably 1300° C. or below.

In the method for manufacturing a wavelength conversion member according to the present invention, the firing is preferably performed in an inert atmosphere, a reductive atmosphere or a vacuum atmosphere.

A light-emitting device according to the present invention includes the above-described wavelength conversion member and a light source operable to irradiate the wavelength conversion member with excitation light.

In the light-emitting device according to the present invention, the light source is preferably a laser diode.

Advantageous Effects of Invention

The present invention enables provision of a wavelength conversion member, a method for manufacturing the wavelength conversion member, and a light-emitting device, which are capable of reducing the temperature rise of the wavelength conversion member and thus reducing the decrease in luminescence intensity with time and deformation and discoloration of constituent materials.

BRIEF DESCRIPTION OF DRAWINGS

FIG. 1 is a schematic cross-sectional view showing a wavelength conversion member according to a first embodiment of the present invention.

FIG. 2 is a schematic cross-sectional view showing a wavelength conversion member according to a second embodiment of the present invention.

FIG. 3 is a schematic cross-sectional view showing a metallic salt-coated phosphor particle in the present invention.

FIG. 4 is a schematic cross-sectional view showing a metallic salt-coated thermally conductive particle in the present invention.

FIG. 5 is a schematic cross-sectional view showing one embodiment of a light-emitting device according to the present invention.

DESCRIPTION OF EMBODIMENTS

Hereinafter, embodiments of the present invention will be described in detail with reference to the drawings. However, the present invention is not at all limited to the following embodiments.

First Embodiment

FIG. 1 is a schematic cross-sectional view showing a wavelength conversion member according to one embodiment of the present invention. The wavelength conversion member 10 includes a matrix 1 and phosphor particles 3 dispersed in the matrix 1. In this embodiment, the matrix 1 is formed of a porous oxide body 2. Hereinafter, a detailed description will be given of the components in this embodiment.

(Matrix 1)

(Porous Oxide Body 2) The average pore diameter of the porous oxide body 2 is 5 μm or less, preferably 3 μm or less, and particularly preferably 1 μm or less. If the average pore diameter is too large, heat produced in the phosphor particles 3 is difficult to release to the outside. In addition, light scattering inside the matrix 1 becomes large, so that the light extraction efficiency of the wavelength conversion member 10 is likely to decrease. The lower limit of the average pore diameter is not particularly limited, but is actually not less than 0.005 μm, not less than 0.01 μm, or particularly not less than 0.05 μm. In the present invention, the average pore diameter indicates a pore diameter corresponding to a maximum peak value in a pore diameter distribution measured by mercury intrusion porosimetry or nitrogen adsorption and desorption. If measurement data cannot be obtained by mercury intrusion porosimetry or nitrogen adsorption and desorption, pores may be closed and isolated, in which case the average pore diameter can be confirmed by observing cross sections of the wavelength conversion member using electron micrograph. A specific example is the following method. First, the wavelength conversion member 10 is repeatedly subjected to surface processing (pitch: 10 μm or less) by focused ion beam (FIB) implantation and image acquisition by SEM observation (magnification: 1000-fold or more), thus obtaining slice images of the wavelength conversion member 10. Next, the obtained plurality of slice images are synthesized and subjected to 3D image processing and, thus, the average pore diameter can be calculated.

In this relation, the above-described pores are gas pores (pores containing a gas, such as air) and, therefore, the porous portions have a lower refractive index as compared to an oxide forming the porous oxide body 2. Therefore, the difference in refractive index between them can provide a light scattering effect. If light scattering is excessive, it is conceivable, for example, to introduce a filler, such as resin, into the porous portions in order to reduce the difference in refractive index. However, because the average pore diameter is relatively small in the present invention, moderate light scattering can be obtained without introducing such a filler.

The porous oxide body 2 is preferably made of a metallic oxide and particularly preferably made of a metallic oxide having high thermal conductivity. Specifically, aluminum oxide, magnesium oxide or zinc oxide is preferred and magnesium oxide is particularly preferred. Magnesium oxide has a high thermal conductivity (45 to 60 $W·m^{-1}·K^{-1}$) and, therefore, can easily and effectively release heat produced in the phosphor particles 3 to the outside. In addition, magnesium oxide less absorbs light in an excitation light wavelength range (for example, 300 to 500 nm) and an emission wavelength range (for example, 380 to 780 nm) of the phosphor particles 3 and is therefore less likely to decrease the light extraction efficiency of the wavelength conversion member 10. These materials may be used singly or in a mixture of two or more of them.

The thermal conductivity of the porous oxide body 2 is preferably 15 $W·m^{-1}·K^{-1}$ or more, more preferably 20 $W·m^{-1}·K^{-1}$ or more, and particularly preferably 30 $W·m^{-1}·K^{-1}$ or more. Thus, heat emitted by the phosphor particles 3 can be easily and effectively released to the outside.

The porosity of the porous oxide body 2 is, relative to the total volume of the wavelength conversion member 10, preferably 10% or less, more preferably 1% or less, and particularly preferably 0.1% or less. If the porosity is too high, heat produced in the phosphor particles 3 is difficult to release to the outside. In addition, the mechanical strength of the wavelength conversion member 10 is likely to decrease. Furthermore, the light extraction efficiency of the wavelength conversion member 10 is likely to decrease. The lower limit of the porosity is not particularly limited, but is actually not less than 0.01%.

(Phosphor Particles 3)

The phosphor particles 3 are preferably inorganic phosphor particles having an excitation band between 300 nm and 500 nm and an emission peak between 380 nm and 780 nm. Examples that can be used include oxide phosphors, nitride phosphors, oxynitride phosphors, chloride phosphors, oxychloride phosphors, halide phosphors, aluminate phosphors, and halophosphoric acid chloride phosphors. Particularly, oxide phosphors and oxynitride phosphors are preferred because they have high thermal resistance and are therefore less likely to degrade during firing. Specifically, particles of garnet-based ceramic phosphors, including YAG (yttrium-aluminum-garnet) phosphor, and particles of phosphors containing SiAlON as a main component, including α-SiAlON phosphor and β-SiAlON phosphor, are preferably used. Particularly, particles of garnet-based ceramic phosphors, including YAG (yttrium-aluminum-garnet) phosphor, are preferably used. Depending on the excitation light wavelength range or emission wavelength rage, a plurality of types of phosphor particles 3 may be used in combination.

The average particle diameter of the phosphor particles 3 is preferably 0.1 to 50 μm, more preferably 1 to 30 μm, still more preferably 3 to 20 μm, and particularly preferably 5 to 10 μm. If the average particle diameter is too small, the phosphor particles 3 are likely to agglomerate during production, so that the luminescent color of the wavelength conversion member 10 is likely to be uneven. In addition, the luminous efficiency of the phosphor particles 3 themselves becomes low, so that the brightness of the wavelength conversion member 10 is likely to decrease. On the other hand, also if the average particle diameter is too large, the luminescent color of the wavelength conversion member 10 is likely to be uneven. In the present invention, the average particle diameter means a value measured by laser diffractometry and indicates the particle diameter when in a volume-based cumulative particle size distribution curve as determined by laser diffractometry the integrated value of cumulative volume from the smaller particle diameter is 50%.

The content of the phosphor particles 3 in the wavelength conversion member 10 is, in terms of % by volume, preferably 0.01 to 80%, more preferably 0.1 to 70%, and particularly preferably 1 to 60%. If the content of the phosphor particles 3 is too large, the proportion of the matrix 1 in the wavelength conversion member 10 becomes relatively small, so that heat produced in the phosphor particles 3 is difficult to release to the outside. If the content of the phosphor particles 3 is too small, a desired luminescence intensity is difficult to obtain. In a transmissive wavelength conversion member 10, if the content of phosphor particles 3 is too large, the amount of transmitted excitation light becomes small, so that the chromaticity of the transmitted light is likely to shift to that of fluorescence. As a result, the chromaticity control of the emitted light becomes difficult. Therefore, the content of the phosphor particles 3 in the transmissive wavelength conversion member 10 is, in terms of % by volume, preferably 0.01 to 50%, more preferably 0.1 to 35%, and particularly preferably 1 to 20%.

(Wavelength Conversion Member 10)

The wavelength conversion member 10 is preferably a sintered body of the matrix 1 and the phosphor particles 3. Thus, the matrix 1 and the phosphor particles 3 are bound to each other, which facilitates more effective release of heat emitted by the phosphor particles 3 to the outside.

The thermal diffusivity of the wavelength conversion member 10 is preferably $2\times10^{-6}$ $m^2/s$ or more, more preferably $3\times10^{-6}$ $m^2/s$ or more, still more preferably $4\times10^{-6}$ $m^2/s$ or more, and particularly preferably $5\times10^{-6}$ $m^2/s$ or more. Thus, even when the wavelength conversion member 10 is irradiated with high-intensity excitation light, heat produced in the phosphor particles 3 can be easily and efficiently released to the outside, so that the temperature rise in the wavelength conversion member 10 can be easily reduced. As a result, the decrease in luminous efficiency of the wavelength conversion member 10 due to temperature rise can be easily reduced.

The quantum efficiency of the wavelength conversion member 10 is preferably 20% or more, more preferably 40% or more, still more preferably 60% or more, and particularly preferably 80% or more. If the quantum efficiency is too low, the amount of energy lost to heat becomes large, so that the luminous efficiency of the wavelength conversion member 10 is likely to decrease. In the present invention, the quantum efficiency indicates a value calculated by the following equation and can be measured with an absolute PL quantum yield spectrometer.

Quantum efficiency=[(the number of photons emitted as fluorescence from a sample)/(the number of photons absorbed by the sample)]×100(%)

Generally, in a wavelength conversion member in which phosphor particles are dispersed in a matrix, there is a trade-off between the thermal diffusivity and the quantum efficiency. For example, in producing a wavelength conversion member by firing, the firing temperature is often set at a high temperature in order to obtain a dense sintered body having a high thermal diffusivity. As a result, the matrix and the phosphor particles react with each other, so that the quantum efficiency is likely to decrease. On the other hand, if the retention of the quantum efficiency of the phosphor particles is pursued, sintering is likely to be insufficient, so that the thermal diffusivity is likely to decrease. Unlike this, the wavelength conversion member 10 according to the present invention can be easily densely sintered even at a relatively low temperature (for example, 1300° C. or below) and therefore can easily maintain both the thermal diffusivity and the quantum efficiency, between which a trade-off would exist in a conventional way, at a high level. Specifically, the product of respective values of the thermal diffusivity ($m^2/s$) and the quantum efficiency (%) of the wavelength conversion member can be set at $8 \times 10^{-5}$ or more, $1 \times 10^{-4}$ or more, $1.5 \times 10^{-4}$ or more, $1.8 \times 10^{-4}$ or more, $2.0 \times 10^{-4}$ or more, $2.1 \times 10^{-4}$ or more, $2.2 \times 10^{-4}$ or more, $2.3 \times 10^{-4}$ or more, $2.4 \times 10^{-4}$ or more, $2.5 \times 10^{-4}$ or more, $3.0 \times 10^{-4}$ or more, $4.0 \times 10^{-4}$ or more, or particularly $5 \times 10^{-4}$ or more. Since the wavelength conversion member has the above value, heat produced in the phosphor particles 3 can be easily and efficiently released to the outside even when the wavelength conversion member is irradiated with high-intensity excitation light. Particularly, the structure of the above-described wavelength conversion member 10 and the structure of a wavelength conversion member 20 to be described later are preferred because both the thermal diffusivity and the quantum efficiency can be easily maintained at a high level.

The shape of the wavelength conversion member 10 can be appropriately selected so that light having a desired color tone can be obtained, and an example is a sheet-like shape (such as a rectangular sheet-like shape or a disc-like shape). The thickness of the wavelength conversion member 10 is preferably 3000 μm or less, more preferably 1000 μm or less, still more preferably 800 μm or less, and particularly preferably 500 μm or less. If the thickness is too large, a desired luminescence intensity is difficult to obtain. Furthermore, the thickness of the wavelength conversion member 10 is preferably not less than 30 μm, more preferably not less than 50 μm, and particularly preferably not less than 80 μm. If the thickness is too small, the mechanical strength of the wavelength conversion member 10 is likely to decrease.

Second Embodiment

FIG. 2 is a schematic cross-sectional view showing a wavelength conversion member according to a second embodiment of the present invention. The wavelength conversion member 20 according to this embodiment is different from the wavelength conversion member 10 according to the first embodiment in that a matrix 1 contains thermally conductive particles 4. Specifically, in this embodiment, the matrix 1 is composed of a porous oxide body 2 and the thermally conductive particles 4. The rest preferably has the same structure as in the above-described wavelength conversion member 10.

(Thermally Conductive Particles 4)

The thermally conductive particles 4 are particles having a thermal conductivity equal to or larger than that of the porous oxide body 2. Since the matrix 1 contains the above thermally conductive particles 4, the thermal conductivity of the entire matrix 1 can be increased. As a result, heat produced in the phosphor particles 3 can be easily and effectively released to the outside.

The thermal conductivity of the thermally conductive particles 4 is preferably 15 $W \cdot m^{-1} \cdot K^{-1}$ or more, more preferably 20 $W \cdot m^{-} \cdot K^{-1}$ or more, and particularly preferably 30 $W \cdot m^{-} \cdot K^{-1}$ or more. Thus, heat emitted by the phosphor particles 3 can be easily and effectively released to the outside.

The thermally conductive particles 4 are preferably made of a metallic oxide and particularly preferably made of a metallic oxide having high thermal conductivity. Specifically, aluminum oxide, magnesium oxide or zinc oxide is preferred and magnesium oxide is particularly preferred. Magnesium oxide has a high thermal conductivity (45 to 60 $W \cdot m^{-1} \cdot K^{-1}$) and, therefore, can easily and effectively release heat produced in the phosphor particles 3 to the outside. In addition, magnesium oxide less absorbs light in an excitation light wavelength range (for example, 300 to 500 nm) and an emission wavelength range (for example, 380 to 780 nm) of the phosphor particles 3 and is therefore less likely to decrease the light extraction efficiency of the wavelength conversion member 20. These materials may be used singly or in a mixture of two or more of them.

The oxide forming the thermally conductive particles 4 is preferably of the same type as the oxide forming the porous oxide body 2. For example, when the porous oxide body 2 is made of magnesium oxide, the thermally conductive particles 4 are preferably also made of magnesium oxide. Thus, when the wavelength conversion member 20 is irradiated with excitation light, cracks due to a difference in coefficient of thermal expansion at the interface between the porous oxide body 2 and the thermally conductive particles 4 are less likely to be produced. Furthermore, excessive light scattering generating at the interface between the porous oxide body 2 and the thermally conductive particles 4 can be easily reduced. In order to make the thermal conductivity of the thermally conductive particles 4 higher than that of the porous oxide body 2, the thermally conductive particles 4 are preferably denser than the porous oxide body 2. Specifically, the apparent density of the thermally conductive particles 4 is preferably higher than that of the porous oxide body 2.

The content of the thermally conductive particles 4 in the wavelength conversion member 20 is, in terms of % by volume, preferably 0 to 90%, more preferably 0.1 to 85%, still more preferably 10 to 80%, and particularly preferably 20 to 70%. If the content of the thermally conductive particles 4 is too large, a wavelength conversion member 20 having a small average pore diameter is difficult to obtain. As a result, heat produced in the phosphor particles 3 is difficult to release to the outside.

The average particle diameter of the thermally conductive particles 4 is preferably 0.1 μm to 50 μm, more preferably 1 μm to 30 μm, still more preferably 1 μm to 20 μm, and particularly preferably 1 μm to 10 μm. If the average particle diameter is too small, light scattering inside of the wavelength conversion member 20 is likely to be excessive, so that the luminescence intensity is likely to decrease. On the other hand, if the average particle diameter is too large, the chromaticity of emitted light of the wavelength conversion member 20 is likely to be uneven.

Where $D_m$ represents the average particle diameter of the thermally conductive particles 4, the relationship between the average particle diameter $D_p$ of the phosphor particles 3 and the average particle diameter $D_m$ of the thermally conductive particles 4 is preferably $0.1 \leq D_p/D_m \leq 10$, more preferably $0.2 \leq D_p/D_m \leq 5$, and particularly preferably $0.3 \leq D_p/D_m \leq 4$. Thus, excessive light scattering inside of the wavelength conversion member 20 can be easily reduced, so that the decrease in luminescence intensity can be easily reduced. When the average particle diameter $D_p$ of the phosphor particles 3 is greater than the average particle diameter $D_m$ of the thermally conductive particles 4 ($1 < D_p < D_m$), a dense wavelength conversion member 20 can be easily obtained.

(Manufacturing Method I of Wavelength Conversion Member)

A manufacturing method I of a wavelength conversion member is a method for manufacturing the wavelength conversion member 10. The manufacturing method I includes the step S1 of mixing and firing phosphor particles 3 and a metallic salt to foam the metallic salt and thus make a porous oxide body 2. By doing so, a wavelength conversion member 10 having a small average pore diameter can be easily obtained and, therefore, a highly thermally conductive wavelength conversion member 10 can be easily obtained.

(Metallic Salt)

The metallic salt preferably contains the same metallic element as that contained as a main component in the oxide forming the porous oxide body 2 and is preferably a carbonate and/or a hydroxide salt. For example, when the porous oxide body 2 is made of magnesium oxide, the metallic salt is preferably magnesium carbonate and/or magnesium hydroxide. For another example, when the porous oxide body 2 is made of aluminum oxide, the metallic salt is preferably aluminum carbonate and/or aluminum hydroxide. These metallic salts may be used singly or in a mixture of two or more of them. Particularly, a carbonate and a hydroxide salt may be preferably used in combination. By doing so, a porous oxide body 2 having a desired average pore diameter can be easily obtained.

The form of the metallic salt is not particularly limited and the metallic salt can be used, for example, in powdered form or gel form.

The metallic salt preferably at least partly releases gas during firing to become decomposed into an oxide forming the porous oxide body 2. Specifically, by firing, the metallic salt is preferably decomposed 90% by volume or more and particularly preferably decomposed 99% by volume or more. When the gas produced during the firing is dispersed into the oxide, a porous oxide body 2 having homogeneous pores is formed. For example, by the application of heat, magnesium carbonate and magnesium hydroxide release carbon dioxide and water vapor, respectively, and are thus decomposed into magnesium oxide.

When the above metallic salt and the phosphor particles 3 are mixed and fired, the metallic salt is foamed, so that a wavelength conversion member 10 including the porous oxide body 2 and the phosphor particles 3 dispersed in the porous oxide body 2 can be obtained. The maximum temperature during firing is preferably 1300° C. or below, more preferably 1200° C. or below, still more preferably 1100° C. or below, and particularly preferably 1000° C. or below. If the maximum temperature during firing is too high, the phosphor particles 3 are likely to be degraded by heat. If the maximum temperature during firing is too low, the decomposition of the metallic salt becomes insufficient, so that the firing is likely to be insufficient. From this viewpoint, the maximum temperature during firing is not lower than 600° C., more preferably not lower than 650° C., and particularly preferably not lower than 700° C.

Furthermore, the maximum temperature during firing is preferably higher than the decomposition temperature of the metallic salt. Specifically, the maximum temperature during firing is preferably the decomposition temperature plus 50° C. or above, more preferably the decomposition temperature plus 100° C. or above, and particularly preferably the decomposition temperature plus 200° C. or above. Thus, the metallic salt can be effectively decomposed during firing, so that a porous oxide body 2 having homogeneous pores can be easily formed.

The firing is preferably performed by hot pressing. By doing so, a porous oxide body 2 having homogeneous pores can be easily formed. The press surface pressure can be appropriately adjusted depending on a desired thickness of the wavelength conversion member 10. For example, the press surface pressure is preferably 1 MPa or more, more preferably 3 MPa or more, and particularly preferably 10 MPa or more. The upper limit of the press surface pressure is not particularly limited, but, for the purpose of preventing breakage of the press mold, it is preferably not more than 100 MPa and particularly preferably not more than 50 MPa.

The pressing time is preferably appropriately adjusted so that the metallic salt can sufficiently adhere to the phosphor particles 3. For example, the pressing time is preferably 0.1 to 300 minutes, more preferably 0.5 to 120 minutes, and particularly preferably 1 to 100 minutes.

The atmosphere during firing is preferably an inert atmosphere, a reductive atmosphere or a vacuum atmosphere. Thus, the degradation of the phosphor particles 3 and the alteration of the porous oxide body 2 can be easily reduced. In addition, the deterioration of the press mold due to oxidation can be easily reduced. Specifically, nitrogen or argon is preferably used in an inert atmosphere. From the viewpoint of running cost, nitrogen is particularly preferably used. In a reductive atmosphere, hydrogen is preferably used and a mixed gas of hydrogen and an inert gas is particularly preferably used. The inert gas used herein refers to nitrogen or argon.

In the manufacturing method I, it is preferred that the phosphor particles 3 are metallic salt-coated phosphor particles in which the phosphor particles 3 are coated with a metallic salt and the metallic salt-coated phosphor particles are fired. Specifically, the method preferably includes: the step S1-1 of preparing metallic salt-coated phosphor particles; and the step S1-2 of firing the metallic salt-coated phosphor particles to foam the metallic salt and thus make a porous oxide body 2. By doing so, the phosphor particles 3 are likely to be present in a dispersed state in the porous oxide body 2. In addition, the phosphor particles 3 are difficult to degrade during firing.

FIG. 3 is a schematic cross-sectional view showing a metallic salt-coated phosphor particle in the present invention. As shown in FIG. 3, in the metallic salt-coated phosphor particle 11, a coating layer 5a made of a metallic salt is formed on at least part of the surface of a phosphor particle 3. In the metallic salt-coated phosphor particles 11, the relationship between the thickness $T_p$ of the coating layer 5a and the average particle diameter $D_p$ of the phosphor particles 3 is preferably $0.01 \leq T_p/D_p \leq 0.3$ and particularly preferably $0.05 \leq T_p/D_p \leq 0.1$. By doing so, the phosphor particles 3 are likely to be present in a dispersed state in the porous oxide body 2. In addition, the phosphor particles 3 are difficult to degrade during firing. If the coating layer 5a is too thick, the amount of metallic salt foamed becomes excessively large and the average pore diameter thus becomes large, so that the thermal diffusivity is likely to decrease. Alternatively, if the coating layer 5a is too thin, the gaps between the phosphor particles 3 cannot sufficiently be filled and, contrariwise, the average pore diameter becomes large, so that the thermal diffusivity is likely to decrease.

First, in the step S1-1, phosphor particles 3 are coated with a metallic salt to make metallic salt-coated phosphor particles 11. The coating method is not particularly limited and, for example, coating layers 5a can be formed on the surfaces of the phosphor particles 3 by the sol-gel method or the solution deposition method.

Next, in the step S1-2, the metallic salt-coated phosphor particles 11 are fired to foam the metallic salt and thus make a porous oxide body 2. The firing in this step can employ the same conditions as in the above-described step S1.

(Manufacturing Method II of Wavelength Conversion Member)

A manufacturing method II of a wavelength conversion member is a method for manufacturing the wavelength conversion member 20. The manufacturing method II includes the step S2 of mixing and firing phosphor particles 3, thermally conductive particles 4, and a metallic salt to foam the metallic salt and thus make a porous oxide body 2. A difference from the method for manufacturing the wavelength conversion member 10 is that the thermally conductive particles 4 are incorporated.

The firing in this step S2 can employ the same conditions as in the above-described step S1.

In the manufacturing method II, it is preferred that the thermally conductive particles 4 are metallic salt-coated thermally conductive particles in which the thermally conductive particles 4 are coated with a metallic salt and the metallic salt-coated thermally conductive particles are fired. Specifically, the method preferably includes: the step S2-1 of preparing metallic salt-coated thermally conductive particles; and the step S2-2 of mixing and firing phosphor particles 3 and the metallic salt-coated thermally conductive particles to foam the metallic salt and thus make a porous oxide body 2. By doing so, agglomeration of the thermally conductive particles 4 can be easily reduced. In addition, the thermally conductive particles 4 and the phosphor particles 3 can be easily firmly bound to each other through the porous oxide body 2 formed of a decomposed metallic salt, which facilitates efficient release of heat emitted by the phosphor particles 3 to the outside.

FIG. 4 is a schematic cross-sectional view showing a metallic salt-coated thermally conductive particle in the present invention. As shown in FIG. 4, in the metallic salt-coated thermally conductive particle 12, a coating layer 5b made of a metallic salt is formed on at least part of the surface of a thermally conductive particle 4. In the metallic salt-coated thermally conductive particles 12, the relationship between the thickness $T_m$ of the coating layer 5b and the average particle diameter $D_m$ of the thermally conductive particles 4 is preferably $0.01 \leq T_m/D_m \leq 0.3$ and particularly preferably $0.05 \leq T_m/D_m \leq 0.1$. Thus, in mixing and firing the thermally conductive particles 4 and the metallic salt, agglomeration of the thermally conductive particles 4 can be easily reduced. If the coating layer 5b is too thick, the amount of metallic salt foamed becomes excessively large and the average pore diameter thus becomes large, so that the thermal diffusivity is likely to decrease. Alternatively, if the coating layer 5b is too thin, the gaps between the phosphor particles 3 and the thermally conductive particles 4 cannot sufficiently be filled and, contrariwise, the average pore diameter becomes large, so that the thermal diffusivity is likely to decrease.

First, in the step S2-1, thermally conductive particles 4 are coated with a metallic salt to make metallic salt-coated thermally conductive particles 12. The coating in this step can be performed in the same manner as in the above-described step S1-1.

Next, in the step S2-2, the phosphor particles 3 and the metallic salt-coated thermally conductive particles 12 are mixed and fired to foam the metallic salt and thus make a porous oxide body 2. The firing in this step can employ the same conditions as in the above-described step S1.

Alternatively, in the manufacturing method II, the phosphor particles 3 may be coated with a metallic salt and thus prepared as metallic salt-coated phosphor particles 11 and the metallic salt-coated phosphor particles 11 and the metallic salt-coated thermally conductive particles 12 are then mixed and fired. By doing so, the phosphor particles 3 and the thermally conductive particles 4 can be easily uniformly dispersed. In addition, the phosphor particles 3 are difficult to degrade during firing. Furthermore, the thermally conductive particles 4 and the phosphor particles 3 can be easily firmly bound to each other through the porous oxide body 2 formed of a decomposed metallic salt, which facilitates efficient release of heat emitted by the phosphor particles 3 to the outside.

(Light-Emitting Device)

FIG. 5 is a schematic cross-sectional view showing a light-emitting device according to one embodiment of the present invention. As shown in FIG. 5, the light-emitting device 50 includes the wavelength conversion member 10 and a light source 6. The light source 6 is disposed so that excitation light $L_0$ enters the wavelength conversion member 10. Excitation light $L_0$ emitted from the light source 6 is converted in wavelength to fluorescence $L_1$ having a longer wavelength than the excitation light $L_0$ by the wavelength conversion member 10. Furthermore, part of the excitation light $L_0$ passes through the wavelength conversion member 10. Therefore, the wavelength conversion member 10 emits synthetic light $L_2$ composed of the excitation light $L_0$ and the fluorescence $L_1$. For example, when the excitation light $L_0$ is a blue light and the fluorescence $L_1$ is a yellow light, a white synthetic light $L_2$ can be provided. Alternatively, the light-emitting device 50 may use the wavelength conversion member 20 instead of the wavelength conversion member 10.

The light source 6 is preferably an LED or an LD. From the perspective of increasing the luminescence intensity of the light-emitting device 50, an LD, which is capable of emitting high-intensity light, is particularly preferably used.

EXAMPLES

Hereinafter, the wavelength conversion member according to the present invention will be described in detail with reference to examples, but the present invention is not limited to the following examples.

Table 1 shows working examples (Nos. 1 and 3 to 10) of the present invention and a comparative example (No. 2).

TABLE 1

|  |  | No. 1 | No. 2 | No. 3 | No. 4 | No. 5 | No. 6 | No. 7 | No. 8 | No. 9 | No. 10 |
|---|---|---|---|---|---|---|---|---|---|---|---|
| Phosphor Particles | Type | YAG | YAG | YAG | YAG | YAG | YAG | YAG | YAG | YAG | YAG |
|  | Average particle diameter (μm) | 24 | 24 | 24 | 24 | 24 | 24 | 24 | 24 | 24 | 24 |
|  | Content (% by volume) | 10 | 20 | 1 | 5 | 20 | 30 | 50 | 10 | 10 | 10 |
| Thermally Conductive Particles | Type | MgO | MgO | MgO | MgO | MgO | MgO | MgO | MgO | MgO | MgO |
|  | Average particle diameter (μm) | 8 | 8 | 8 | 8 | 8 | 8 | 8 | 8 | 8 | 8 |
|  | Content (% by volume) | 65 | 80 | 77 | 71 | 59 | 47 | 26 | 77 | 46 | 32 |
| Metallic Salt | Type | $MgCO_3$/$Mg(OH)_2$ | — | $MgCO_3$/$Mg(OH)_2$ | $MgCO_3$/$Mg(OH)_2$ | $MgCO_3$/$Mg(OH)_2$ | $MgCO_3$/$Mg(OH)_2$ | $MgCO_3$/$Mg(OH)_2$ | $MgCO_3$/$Mg(OH)_2$ | $MgCO_3$/$Mg(OH)_2$ | $MgCO_3$/$Mg(OH)_2$ |
|  | Thickness (μm) | 1.0 | — | 0.8 | 0.9 | 0.9 | 1.1 | 1.5 | 0.5 | 2.0 | 3.0 |
| Firing Conditions | Thermal treatment temperature (° C.) | 1000 | 1000 | 1000 | 1000 | 1000 | 1000 | 1000 | 1000 | 1000 | 1000 |
|  | Press pressure (MPa) | 48 | — | 48 | 48 | 48 | 48 | 48 | 48 | 48 | 48 |
|  | Pressing time (min) | 60 | — | 60 | 60 | 60 | 60 | 60 | 60 | 60 | 60 |
|  | Thermal treatment atmosphere | $N_2$ | air | $N_2$ | $N_2$ | $N_2$ | $N_2$ | $N_2$ | $N_2$ | $N_2$ | $N_2$ |
| Thermal diffusivity ($\times 10^{-6}$ m²/s) |  | 5.7 | 1.0 | 6.1 | 5.9 | 5.5 | 5.4 | 3.4 | 5.5 | 5.6 | 4.7 |
| Quantum efficiency (%) |  | 89 | 79 | 90 | 90 | 90 | 88 | 87 | 90 | 90 | 90 |
| Average pore diameter (μm) |  | 1.0 | 10.0 | 0.9 | 0.9 | 1.0 | 2.1 | 3.0 | 1.6 | 1.5 | 2.8 |

Each of the working examples (Nos. 1 and 3 to 10) was produced in the following manner. First, metallic salt-coated phosphor particles and metallic salt-coated thermally conductive particles were produced by the solution deposition method. The obtained metallic salt-coated phosphor particles and metallic salt-coated thermally conductive particles were mixed so that phosphor particles and thermally conductive particles reach respective contents shown in Table 1, thus obtaining a mixture. The respective contents (% by volume) of the phosphor particles and the thermally conductive particles are indicated as respective proportions relative to the sum of the volumes of the phosphor particles, the thermally conductive particles, and an "oxide under the assumption that the entire metallic salt added was decomposed into a porous oxide body". Furthermore, the materials used were as follows.

(a) Phosphor Particles

YAG phosphor particles ($Y_3Al_5O_{12}$, average particle diameter: 24 μm)

(b) Thermally Conductive Particles

MgO particles (thermal conductivity: approximately 45 W/m·K, average particle diameter: 8 μm, refractive index (nd): 1.74)

(c) Coating Layer

Mixture of magnesium carbonate and magnesium hydroxide

The above-described obtained mixture was put into a mold, fired therein by hot pressing under the conditions described in Table 1, and then gradually cooled to ordinary temperature, thus producing a wavelength conversion member as a sintered body.

The comparative example (No. 2) was produced in the following manner. First, phosphor particles and thermally conductive particles were mixed to give their contents shown in Table 1, thus obtaining a mixture. The materials used were the same as those in the working example (No. 1).

The above-described obtained mixture was put into a mold, pressed therein at a pressure of 0.45 MPa to form into a compacted body, and then fired under the conditions described in Table 1. After the firing, the mixture was gradually cooled to ordinary temperature, thus producing a wavelength conversion member as a sintered body.

The obtained wavelength conversion members were each polished into a plate-like sample having a thickness of 500 μm and then evaluated in terms of thermal diffusivity, quantum efficiency, and average pore diameter in the following manners. The results are shown in Table 1.

The thermal diffusivity was measured with a thermal diffusivity measurement system ai-phase manufactured by ai-Phase Co., Ltd. The measurement of the thermal diffusivity for each sample was made eleven times in total under a condition of 105° C. plus/minus 5° C. and the value obtained by averaging the eleven measurement results was employed as the thermal diffusivity of the sample.

The quantum efficiency refers to a value calculated by the following equation and was measured with an absolute PL quantum yield spectrometer (manufactured by Hamamatsu Photonics K.K.).

Quantum efficiency=[(the number of photons emitted as fluorescence from a sample)/(the number of photons absorbed by the sample)]×100(%)

The average pore diameter was measured by subjecting each sample to surface processing at a pitch of 0.1 μm by FIB implantation, taking 300 SEM images at 5000-fold magnification, and subjecting the obtained images to 3D image processing using VGSTUDIO MAX manufactured by Volume Graphics GmbH.

As is obvious from Table 1, the wavelength conversion members of the working examples (Nos. 1 and 3 to 10) exhibited high thermal diffusivities of $3.4 \times 10^{-6}$ m²/s or more. Furthermore, their quantum efficiencies were as high as 87% or more. On the other hand, the wavelength conversion member of the comparative example (No. 2) exhibited a low thermal diffusivity of $1 \times 10^{-6}$ m²/s and a low quantum efficiency of 79%.

REFERENCE SIGNS LIST 1 matrix
2 porous oxide body
3 phosphor particle
4 thermally conductive particle
5a, 5b coating layer 6 light source
10, 20 wavelength conversion member
11 metallic salt-coated phosphor particle
12 metallic salt-coated thermally conductive particle
50 light-emitting device

The invention claimed is:

1. A wavelength conversion member including a matrix and phosphor particles dispersed in the matrix, the matrix being formed of a porous oxide body having an average pore diameter of 5 μm or less.

2. The wavelength conversion member according to claim 1, wherein the matrix has a porosity of 10% or less.

3. The wavelength conversion member according to claim 1, wherein the matrix is made of magnesium oxide.

4. The wavelength conversion member according to claim 1, wherein the matrix further contains thermally conductive particles.

5. The wavelength conversion member according to claim 4, wherein the thermally conductive particles are made of magnesium oxide.

6. The wavelength conversion member according to claim 4, satisfying a condition (A) below where $D_p$ represents an average particle diameter of the phosphor particles and $D_m$ represents an average particle diameter of the thermally conductive particles:

$$0.1 \leq D_p/D_m \leq 10 \tag{A}$$

7. The wavelength conversion member according to claim 1, wherein a content of the phosphor particles is 0.01 to 80% by volume.

8. A wavelength conversion member including phosphor particles dispersed in a matrix made of an oxide and having a thermal diffusivity of $2\times10^{-6}$ m$^2$/s or more.

9. The wavelength conversion member according to claim 1, having a quantum efficiency of 20% or more.

10. The wavelength conversion member according to claim 1, wherein a product of respective values of a thermal diffusivity (m$^2$/s) and a quantum efficiency (%) is $8\times10^{-5}$ or more.

11. A method for manufacturing the wavelength conversion member according to claim 1, the method comprising the step of mixing and firing phosphor particles and a metallic salt to foam the metallic salt and thus make a porous oxide body.

12. The method for manufacturing the wavelength conversion member according to claim 11, the method comprising the steps of:
coating the phosphor particles with the metallic salt to prepare metallic salt-coated phosphor particles; and
firing the metallic salt-coated phosphor particles to foam the metallic salt and thus make a porous oxide body.

13. The method for manufacturing the wavelength conversion member according to claim 11, wherein a condition (B) below is satisfied where $T_p$ represents a thickness of coating layers of the metallic salt-coated phosphor particles and $D_p$ represents an average particle diameter of the phosphor particles:

$$0.01 \leq T_p/D_p \leq 0.3 \tag{B}$$

14. A method for manufacturing the wavelength conversion member according to claim 4, the method comprising the step of mixing and firing phosphor particles, thermally conductive particles, and a metallic salt to foam the metallic salt and thus make a porous oxide body.

15. The method for manufacturing the wavelength conversion member according to claim 14, the method comprising the steps of:
coating the thermally conductive particles with a metallic salt to prepare metallic salt-coated thermally conductive particles; and
mixing and firing phosphor particles and the metallic salt-coated thermally conductive particles to foam the metallic salt and thus make a porous oxide body.

16. The method for manufacturing the wavelength conversion member according to claim 14, wherein a metallic element contained in the metallic salt is of the same type as a metallic element contained as a main component in the thermally conductive particles.

17. The method for manufacturing the wavelength conversion member according to claim 15, wherein the phosphor particles are coated with the metallic salt to prepare metallic salt-coated phosphor particles and the metallic salt-coated phosphor particles and the metallic salt-coated thermally conductive particles are mixed and fired.

18. The method for manufacturing the wavelength conversion member according to claim 11, wherein the metallic salt is composed of a carbonate and/or a hydroxide salt.

19. A light-emitting device comprising:
the wavelength conversion member according to claim 1; and a light source operable to irradiate the wavelength conversion member with excitation light.

20. The light-emitting device according to claim 19, wherein the light source is a laser diode.

* * * * *